United States Patent
Mirkhani et al.

(10) Patent No.: US 6,864,698 B2
(45) Date of Patent: Mar. 8, 2005

(54) HYBRID COOLING SYSTEM FOR AUTOMATIC TEST EQUIPMENT

(75) Inventors: Ray Mirkhani, Porter Ranch, CA (US); John Mahoney, Hermosa Beach, CA (US)

(73) Assignee: Teradyne, Inc., Boston, MA (US)

(*) Notice: Subject to any disclaimer, the term of this patent is extended or adjusted under 35 U.S.C. 154(b) by 0 days.

(21) Appl. No.: 10/396,589

(22) Filed: Mar. 24, 2003

(65) Prior Publication Data

US 2004/0189280 A1 Sep. 30, 2004

(51) Int. Cl.[7] .................................. G01R 31/02
(52) U.S. Cl. ................ 324/760; 324/158.1; 165/80.2
(58) Field of Search ............... 324/760, 158.1, 324/765, 754; 165/80.1–80.5, 104.4; 438/14–18; 118/712; 361/699, 688, 694; 62/434, 114, 430

(56) References Cited

U.S. PATENT DOCUMENTS

| | | | | |
|---|---|---|---|---|
| 5,285,347 A | * | 2/1994 | Fox et al. | 361/699 |
| 5,889,651 A | * | 3/1999 | Sasaki et al. | 361/699 |
| 5,952,842 A | * | 9/1999 | Fujimoto | 324/760 |
| 6,148,634 A | * | 11/2000 | Sherwood | 62/434 |
| 6,184,676 B1 | * | 2/2001 | Baker et al. | 324/158.1 |
| 6,208,510 B1 | * | 3/2001 | Trudeau et al. | 361/696 |
| 6,257,319 B1 | * | 7/2001 | Kainuma et al. | 165/11.1 |
| 6,310,486 B1 | * | 10/2001 | Trevisan et al. | 324/765 |
| 6,552,560 B2 | * | 4/2003 | Melgaard et al. | 324/760 |

* cited by examiner

Primary Examiner—David Zarneke
Assistant Examiner—Jimmy Nguyen
(74) Attorney, Agent, or Firm—Teradyne Legal Department

(57) ABSTRACT

Automatic test equipment is disclosed including a console and a testhead cooled by a hybrid cooling system. The testhead includes a card cage assembly having a plurality of slots disposed in spaced-apart relationship and adapted for receiving a plurality of electronic board assemblies. The hybrid cooling system includes a first cooling assembly coupled to the card cage assembly for distributing a first cooling medium proximate the electronic board assemblies and a second cooling assembly. The second cooling assembly is disposed proximate the card cage assembly and includes user-activatable cooling ports for selective access to a second cooling medium for the electronic board assemblies.

12 Claims, 4 Drawing Sheets

HYBRID COOLING SYSTEM FOR AUTOMATIC TEST EQUIPMENT

FIELD OF THE INVENTION

The invention relates generally to automatic test equipment, and more particularly a hybrid cooling system for cooling a semiconductor tester testhead.

BACKGROUND OF THE INVENTION

Automatic test equipment (ATE) plays a pivotal role in the manufacture of semiconductor devices. The equipment, often referred to as a tester, typically provides at-speed functional verification of semiconductor devices at the wafer level and/or packaged device level. Ensuring that individual devices work properly before implementation in a higher assembly is critical to the commercial acceptance of a device.

As semiconductor devices become more complex, the ATE required to test them often rises in sophistication and cost. Even more problematic is the trend towards system-on-chip, or SoC devices, that employ both analog and digital circuitry on a single chip. Often, such devices require a variety of instruments in the ATE to adequately perform functional test. Such instruments may include AC and DC instrumentation in the form of waveform analyzers, digitizers, RF signal generators, and others.

The instruments employed by the ATE typically reside in a testhead. The testhead serves as a somewhat mobile housing for the instrument electronics. The testhead is mobile in the sense that it may be manipulated into a position proximate the device-under-test (DUT) to minimize signal delays between the instrument electronics and the DUT. Further, the testhead typically includes a backplane for plugging in the instrument boards. In a sense, the testhead is a specialized rack or card cage.

Conventional instrument cards typically require some form of cooling. The art is replete with air cooled systems and liquid-cooled systems for use in semiconductor testheads. An example of an air cooling system is found in U.S. Pat. No. 6,208,510. Liquid cooling systems are typically employed in the form of cold plates that attach to high-power boards, or inflatable modules that compress against the hot components of a board to draw heat therefrom. One example of such a module is described in U.S. Pat. No. 5,871,042.

While the air and liquid cooling systems described above work well for their intended purposes, the entire cardcage is typically configured to support one form of cooling, or the other. This scheme was acceptable for ATE built for testing solely low performance devices (often requiring only air cooling), or ATE built for testing solely high performance devices (typically requiring liquid cooling). However, modern ATE, such as for example the J971 semiconductor tester with logic, analog and memory test instruments (manufactured by Teradyne, Inc., Agoura Hills, Calif.), provide a single platform test approach. This platform enables the testing of devices that span the performance spectrum.

What would be desirable is a testhead cooling configuration that universally supports instrument cards requiring air and/or liquid cooling, but at low cost. The hybrid cooling system of the present invention satisfies these needs.

SUMMARY OF THE INVENTION

The hybrid cooling system of the present invention provides a cost-effective and universal way to provide air and/or liquid cooling for each slot location in a semiconductor tester testhead.

To realize the foregoing advantages, the invention in one form comprises automatic test equipment is including a console and a testhead cooled by a hybrid cooling system. The testhead includes a card cage assembly having a plurality of slots disposed in spaced-apart relationship and adapted for receiving a plurality of electronic board assemblies. The hybrid cooling system includes a first cooling assembly coupled to the card cage assembly for distributing a first cooling medium proximate the electronic board assemblies and a second cooling assembly. The second cooling assembly is disposed proximate the card cage assembly and includes user-activatable cooling ports for selective access to a second cooling medium for the electronic board assemblies.

In another form, the invention comprises a method of cooling electronic board assemblies in automatic test equipment. The method includes the steps of distributing a first cooling medium across the plurality of electronic board assemblies and selectively providing access for each board assembly to a second cooling medium.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

The hybrid cooling system of the present invention enables a true universal slot architecture for a semiconductor testhead 20, where different instruments may be universally compatible with any of the instrument slot locations within the testhead. This is made possible by providing a first cooling assembly 40 to distribute a first cooling medium proximate the instruments, and a second cooling assembly 50 for selective application of a second cooling medium to each of the instrument slot locations.

Figure 1:
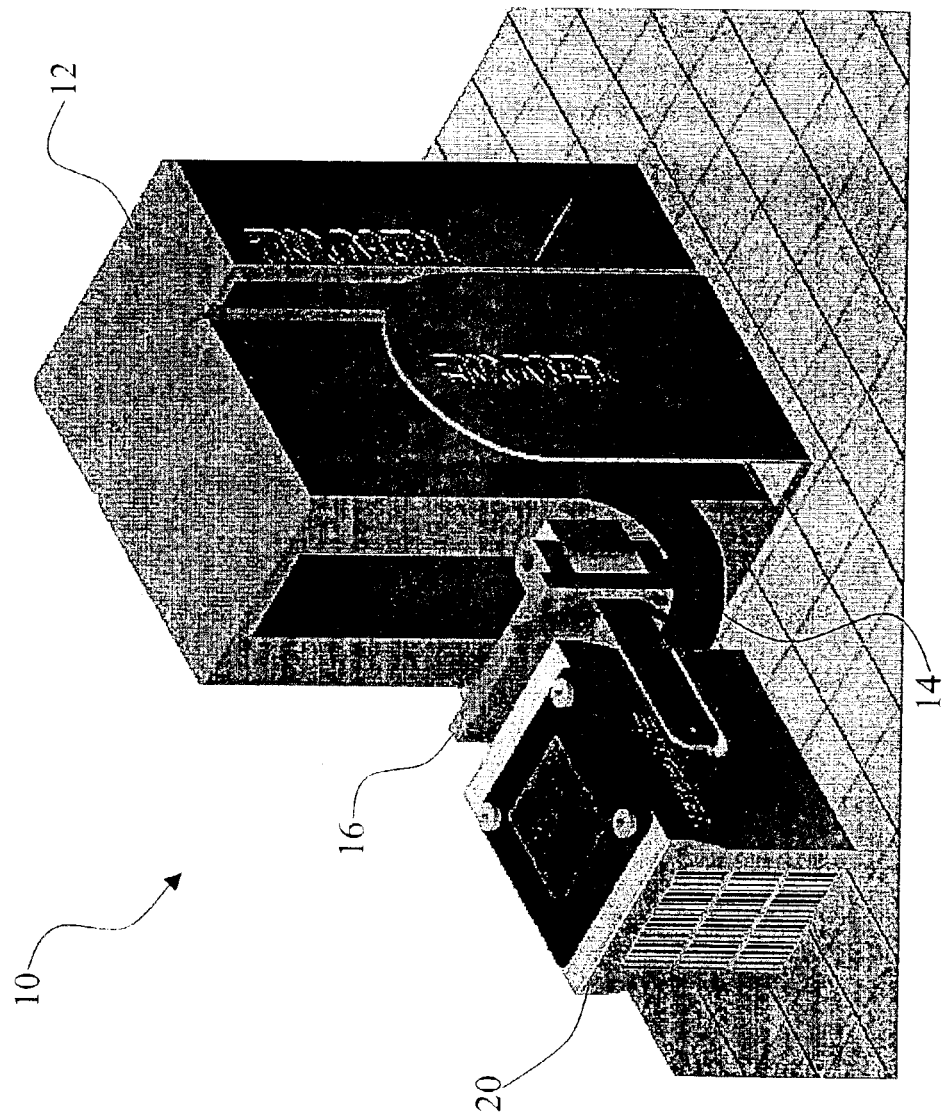
FIG. 1 is an elevated perspective view of a semiconductor tester employing a testhead having the hybrid cooling system of the present invention.

Referring now to FIG. 1, a semiconductor tester according to one form of the present invention, generally designated 10, includes a main console 12 to house various electronic sub-assemblies that support the operation of the tester instruments. The testhead 20 couples to the console via a cable bundle 14 and serves as an extension of the tester in an effort to place the tester instruments as close to the device-under-test (DUT) as possible. A manipulator 16 disposed adjacent the console carries and positions the testhead with respect to a handling apparatus (not shown), such as a packaged-device handler or wafer prober.

The instrument boards adapted for installation within the testhead 20 resemble large rectangular circuit boards, with a size on the order of approximately 17 inches by 26 inches.

The boards may comprise digital instuments such as waveform digitizers, digital signal generators, analog instuments such as RF signal generators and other analog waveform analyzers, memory test instrumentation or the like. Because different boards require varying levels of cooling, the testhead is configured for maximum cooling flexibility while maintaining low cost.

Figure 2:
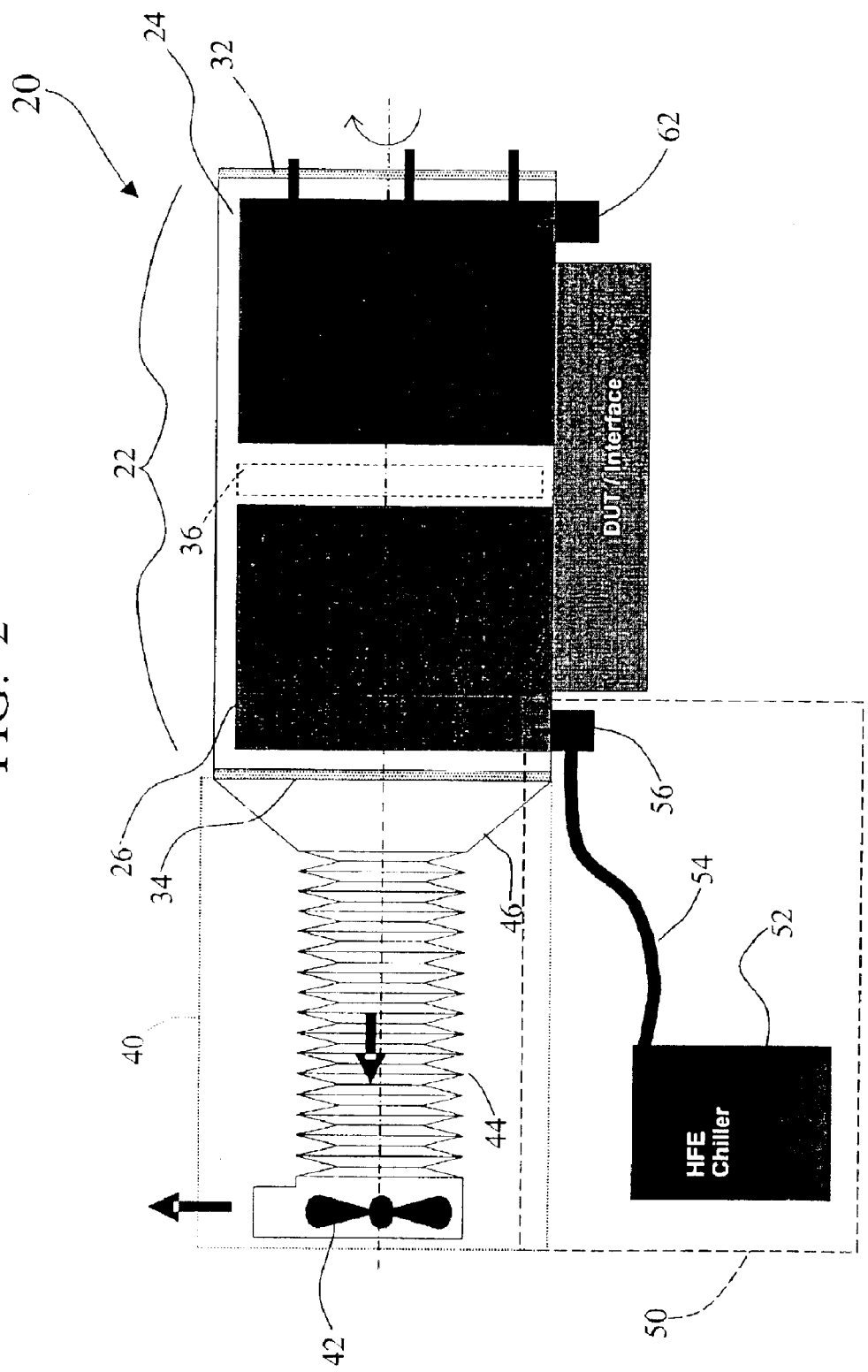
FIG. 2 is a block diagram of the hybrid cooling system employed in the testhead of FIG. 1.

With reference to FIG. 2, the testhead 20 in accordance with one form of the present invention, includes a card cage area 22 for installing one or more card cages. The card cage area is configured to support respective upstream and downstream card cages 24 and 26, depending on the instrument requirements of the user. As seen more clearly in FIG. 3, the card cages are formed with a sheet-metal frame and provide space for a linear air cooling path (shown by the flow arrows).

Figure 3:
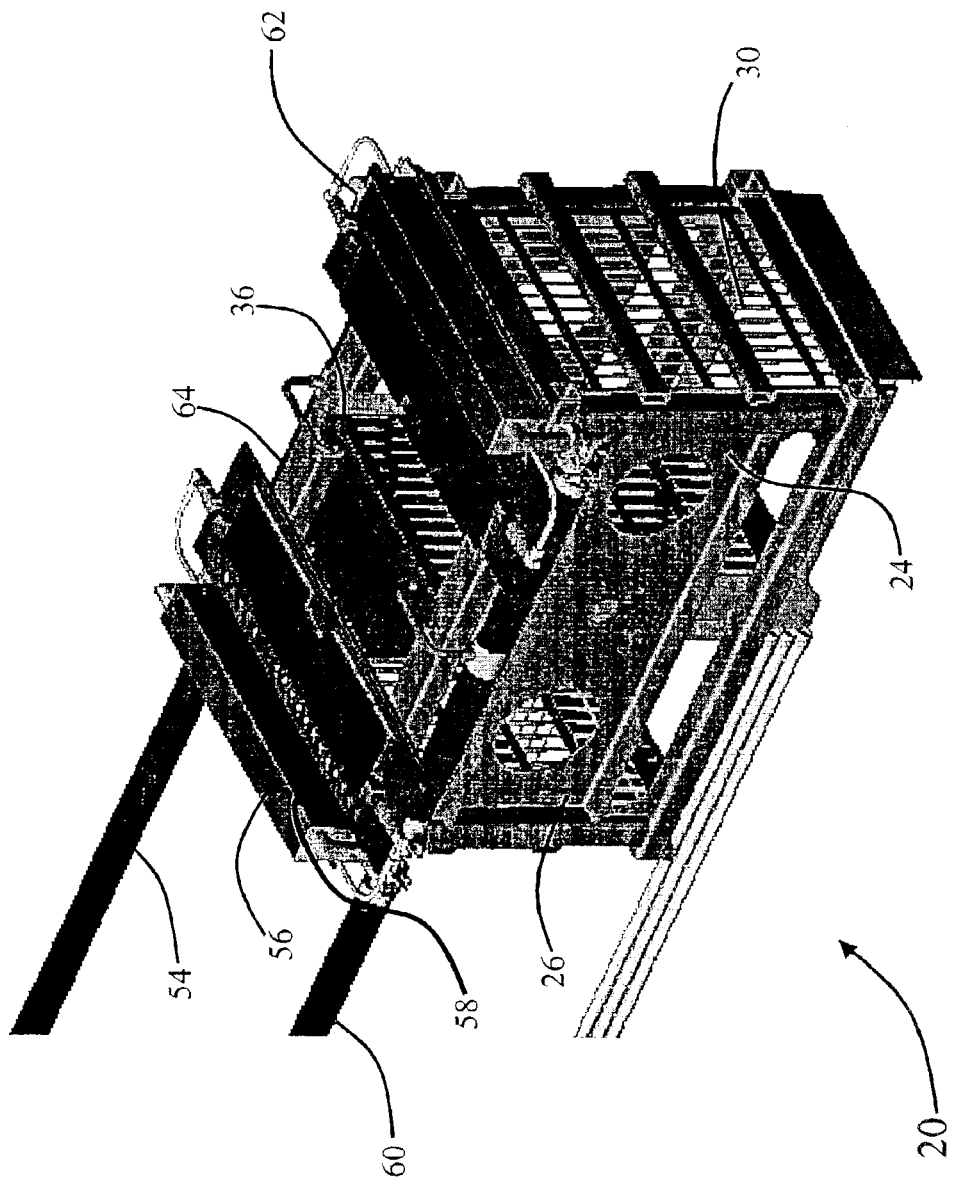
FIG. 3 is a more detailed view of the hybrid cooling system of FIG. 2.

Referring to FIGS. 2 and 3, each of the card cages 24 and 26 includes a plurality of spaced-apart slots 30 (FIG. 3) or guides that are adapted for receiving the instrument boards (not shown). Respective inlet and outlet safety/EMI shield screens 32 and 34 are disposed on each end of the card cage cooling path. In the likely event that both card cages are utilized, an optional heat exchanger 36 (in phantom) is employed between the card cages to improve the cooling performance for a first cooling assembly 40, more fully described below.

The first cooling assembly 40 comprises an air-cooling scheme that couples to the downstream card cage 26 and cooperates with the spaced-apart nature of the cardcage slots along the cooling path to effect a desirable level of air cooling. The first cooling assembly includes a remotely mounted impeller 42, or fan, coupled through a flexible accordion-shaped duct 44 to a transition duct section 46. The transition section attaches to the downstream card cage outlet screen 34. Ambient air is the preferred coolant medium for the first cooling assembly, being drawn serially through the card cages 24 and 26, along the cooling path between the boards, and into the transition and flexible ducts 46 and 44, where it is discharged from the tester 10 back into the outside operating environment. Preferably, the fan and ducting are configured to provide an airflow rate of approximately 1700 CFM distributed uniformly across the boards to provide approximately 12000 watts of cooling.

While the first cooling assembly 40 described above adequately cools instrument boards that dissipate relatively low power in the range of around 200 to 500 watts, high power digital instrument boards that dissipate power above 500 watts are not well served by this cooling technique alone. In an effort to enable the use of high power instrument boards within the testhead 20, and to provide the flexibility for allowing the installation of these boards into any slot, the testhead provides for a second cooling assembly 50 to selectively provide cooling by a second cooling medium, such as liquid.

Referring now to FIG. 3, the second cooling assembly 50 provides a source of liquid coolant for those boards equipped with cold plates or liquid cooling modules. An example of a liquid cooling module, or LCM, is described in U.S. Pat. No. 5,871,042, assigned to the assignee of the present invention, and expressly incorporated herein by reference.

Further referring to FIG. 3, the second cooling assembly 50 includes a liquid coolant source, such as a chiller 52 (FIG. 2), to pump a coolant to and from the testhead 20. The chiller preferably comprises a closed scheme having a pump (not shown) without rotating seals, such as a submerged or magnetically driven design. While the chiller heat load capacity may very, depending on the number of high-power boards employed in the testhead, the inventors have determined that for many applications a heat load capacity of approximately 18 Kw with a flow rate capacity of approximately 30 gpm provides sufficient cooling.

The chiller 52, as noted above, pumps a liquid coolant such as HFE, through a flexible metal hose 54 to a rear manifold assembly 56. HFE-7100, available from the 3M Corporation, is a preferred coolant based on its dielectric and low toxicity properties.

The rear manifold assembly 56 is formed of an HFE compatible metal, such as copper, brass, stainless steel or aluminum, and spans the lateral length of the downstream card cage 26. The manifold includes a pair of elongated internal chambers (not shown) that distribute and discharge the coolant flow to and from an array of access and discharge ports terminated by respective quick-disconnect fittings 58 proximate each of the cardcage slots. One of the manifold chambers provides freshly chilled coolant to one set of fittings, while the other chamber provides a discharge area for heated coolant that has already circulated through the assembly. A flexible metallic effluent hose 60 returns the discharged coolant back to the chiller 52 where it is chilled and recirculated back into the second cooling assembly 50.

With continued reference to FIG. 3, the second cooling assembly 50 further includes a front manifold assembly 62 configured similarly to the rear manifold assembly 56. The front manifold assembly couples to the coolant inlet hose 54 via a manifold-to-manifold line 64 to provide a similar array of access and discharge ports for the upstream cardcage 24. In effect, each of the card cage slots has the availability of liquid cooling inlet and discharge lines for an instrument board cold plate or LCM—if needed.

Figure 4:
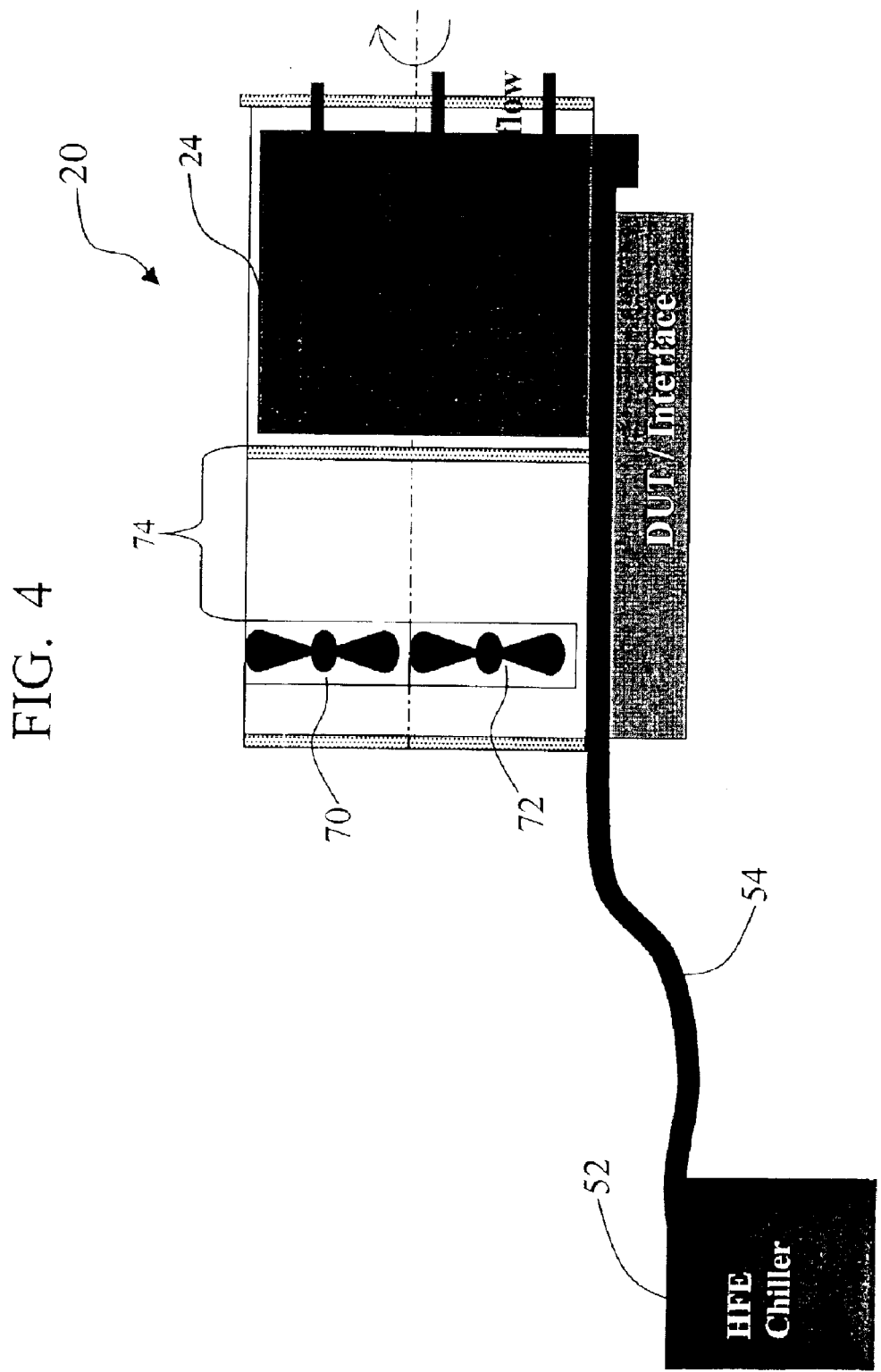
FIG. 4 is a block diagram of an alternative embodiment of the hybrid cooling system of FIG. 2.

In circumstances where only one of the two card cages 24 and 26 are needed for instrument installations, the optional heat exchanger 36 may be omitted to further lower costs. FIG. 4 illustrates such a configuration. In this application, the impeller 42 may be replaced by a pair of vertically aligned axial fans 70 and 72, having an approximate diameter of around 13 inches to provide sufficient cooling airflow. A plenum space 74 separates the fans from the upstream card cage 24 to allow for maximum airflow distribution.

Prior to operation, the user is free to arrange the tester instrument boards in any desired configuration without the need to customize liquid cooling lines for a particular high-power board type. Moreover, each slot 30 need not include a pre-installed LCM assembly. For boards that operate sufficiently with air cooling, that feature is provided automatically by the first cooling assembly 40. Where liquid cooling is needed, the availability of the second cooling assembly 50 to provide a liquid cooling line proximate each cardcage slot allows for a minimal plumbing modification to activate liquid cooling for that slot. As a result, the cost of liquid cooling is scaled in line with actual need and usage.

Those skilled in the art will appreciate the many benefits and advantages afforded by the present invention. Of significant importance is the availability of selectable cooling modes for each slot in the testhead, allowing for a true universal slot architecture. This provides the user with flexibility in assembling both low power and high power instrument boards consistent with a single platform tester approach to testing semiconductor devices.

A further advantage provided by the present invention involves the low cost that is achievable by scaling the liquid cooling requirements with the number of boards actually requiring liquid cooling. Additionally, because of the implementation of the air cooling assembly for all of the boards, the liquid cooling assembly requirements may be lower than a stand-alone liquid cooling system. As a result, lower performing components and sub-assemblies may be utilized, correspondingly reducing costs.

While the invention has been particularly shown and described with reference to the preferred embodiments thereof, it will be understood by those skilled in the art that various changes in form and detail may be made therein without departing from the spirit and scope of the invention.

What is claimed is:

1. Automatic test equipment including:
   a console;
   a testhead coupled to the console, the testhead including a card cage assembly having a plurality of slots disposed in spaced-apart relationship, the plurality of slots adapted for receiving a plurality of electronic board assemblies; and
   a hybrid cooling system including
      a first cooling assembly coupled to the card cage assembly for distributing a first cooling medium proximate the electronic board assemblies; and
      a second cooling assembly disposed proximate the card cage assembly and including user-activatable cooling ports for selective access to a second cooling medium for the plurality of electronic board assemblies.

2. Automatic test equipment according to claim 1 wherein:
   the first cooling system includes a fan, and the first cooling medium comprises a gas.

3. Automatic test equipment according to claim 2 wherein:
   the gas comprises air.

4. Automatic test equipment according to claim 1 wherein:
   a portion of the plurality of electronic assemblies include circuit boards requiring liquid cooling.

5. Automatic test equipment according to claim 1 wherein:
   a portion of the plurality of electronic assemblies include circuit boards requiring only air cooling.

6. Automatic test equipment according to claim 1 wherein:
   the circuit boards requiring liquid cooling are adapted to receive the liquid cooling medium, and include couplers for engaging the access ports.

7. Automatic test equipment according to claim 1 wherein:
   the second cooling medium comprises a liquid.

8. Automatic test equipment according to claim 7 wherein:
   the liquid comprises HFE.

9. Automatic test equipment according to claim 1 wherein the card cage assembly comprises:
   a first card cage; and
   a second card cage disposed serially with the first card cage, the first and second card cages cooperating to form a linear coolant path.

10. Automatic test equipment according to claim 9 and further including:
    a heat exchanger interposed between the first and second card cages in the linear coolant path.

11. Automatic test equipment including:
    a console;
    means for housing a plurality of electronic board assemblies; and
    means for cooling the plurality of electronic board assemblies with a combination of air and liquid cooling media;
    wherein the means for housing a plurality of electronic board assemblies comprises a testhead coupled to the console, the testhead including a card case assembly having a plurality of slots disposed in spaced-apart relationship, the plurality of slots adapted for receiving a plurality of electronic board assemblies.

12. Automatic test equipment including:
    a console;
    means for housing a plurality of electronic board assemblies; and
    means for cooling the plurality of electronic board assemblies with a combination of air and liquid cooling media;
    wherein the means for cooling the plurality of electronic board assemblies comprises:
    a hybrid cooling system including
       a first cooling assembly coupled to the card cage assembly for distributing a first cooling medium proximate the electronic board assemblies; and
       a second cooling assembly disposed proximate the card cage assembly and including user-activatable cooling ports for selective access to a second cooling medium for the plurality of electronic board assemblies.

* * * * *